(12) United States Patent
Saiki et al.

(10) Patent No.: US 6,518,518 B1
(45) Date of Patent: *Feb. 11, 2003

(54) RESIN SUBSTRATE

(75) Inventors: Hajime Saiki, Aichi (JP); Motohiko Itai, Kani (JP)

(73) Assignee: NGK Spark Plug Co., Ltd., Aichi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/476,988

(22) Filed: Jan. 4, 2000

(30) Foreign Application Priority Data

Jan. 27, 1999 (JP) ............................. 11-018477

(51) Int. Cl.[7] ............................. H05K 1/11; H01R 12/04
(52) U.S. Cl. ..................................... 174/267; 361/772
(58) Field of Search ............... 174/267; 439/45–48, 439/75, 74; 361/772–779

(56) References Cited

U.S. PATENT DOCUMENTS

| | | | | |
|---|---|---|---|---|
| 4,112,141 A | | 9/1978 | Yoshida et al. | 427/142 |
| 5,373,110 A | * | 12/1994 | Inasaka | 174/267 |
| 5,397,598 A | * | 3/1995 | DiPaolo et al. | 427/282 |
| 5,411,703 A | | 5/1995 | Gonya et al. | 420/561 |
| 5,448,016 A | * | 9/1995 | DiPaolo et al. | 174/126.1 |
| 5,731,066 A | * | 3/1998 | Ando et al. | 428/210 |
| 5,791,911 A | | 8/1998 | Fasano et al. | 439/63 |
| 6,008,071 A | * | 12/1999 | Karasawa et al. | 438/115 |
| 6,033,488 A | * | 3/2000 | An et al. | 148/24 |
| 6,184,587 B1 | * | 2/2001 | Khandros et al. | 257/784 |

FOREIGN PATENT DOCUMENTS

| | | |
|---|---|---|
| GB | 2 319 039 | 5/1998 |
| JP | 52-135123 | 11/1977 |
| JP | 54-76461 | 6/1979 |
| JP | 55-18505 | 2/1980 |
| JP | 55-141397 | 11/1980 |
| JP | 60-9260 | 1/1985 |
| JP | 60-106370 | 7/1985 |
| JP | 63-123594 | 5/1988 |
| JP | 2-61604 | 3/1990 |
| JP | 3-145791 | 6/1991 |
| JP | 5-77083 | 3/1993 |
| JP | 7-51883 | 2/1995 |
| JP | 7-88679 | 4/1995 |
| JP | 10-137971 | 5/1998 |
| JP | 10-172695 | 6/1998 |
| JP | 10-286689 | 10/1998 |

* cited by examiner

Primary Examiner—Albert W. Paladini
Assistant Examiner—Jeremy C Norris

(57) ABSTRACT

A resin substrate is made of resin or a composite material containing resin. Pins each having the surface, on which Au plating is formed, are, with a soldering material made of Sn and Sb, soldered to a substrate body having a first main surface and formed into substantially a rectangular shape to project over the first main surface 2A of the substrate body. Wettability of the soldering material for securing the pins and the substrate body to one another is relatively low as compared with that of a Pb—Sn soldering material. Therefore, the height of upward movement of the soldering material along the pin can be reduced. Hence it follows that the pins can sufficiently deeply be inserted into the socket so that the gap between the first main surface of the substrate body and the upper surface of the socket is reduced. As a result, the overall height realized after the substrate made of resin has been joined to the socket can be reduced

9 Claims, 7 Drawing Sheets

RESIN SUBSTRATE

BACKGROUND OF THE INVENTION

1. Field of the Invention

The present invention relates to a resin substrate, which has a substrate body and a pin serving as an input/output terminal, and more particularly to a resin substrate having a pin which can reliably be connected to a socket or another substrate.

2. Description of the Related Art

Conventionally, a structure has been known in which a pin serving as an input/output terminal is secured and stood erect on a substrate body made of an insulating material, such as resin, for example, epoxy resin, or composite material of the resin and glass fibers, the pin being secured and stood erect by using a lead and tin (hereafter "Pb—Sn") soldering material, such as Pb—Sn eutectic solder.

As the foregoing resin substrate, a resin substrate 101 structured, for example, as shown in FIG. 6 is exemplified. A substrate body 102 of the resin substrate 101 has a resin insulating layer 103 and a circuit layer (not shown). A first main surface 102A of the resin substrate 101 has a connection pad 104 formed thereon. A solder resist layer 105 is formed to reach the edge of the connection pad 104.

The pin 11 has a large-diameter portion 111A and a shaft portion 111b and having a structure that the overall surface is applied with nickel (hereafter "Ni") plating or gold (hereafter "Au") plating (not shown). The large-diameter portion 111A of the pin 111 is secured with a soldering material 115 to be opposite to the connection pad 104 allowed to expose over the solder resist layer 105. The soldering material 115 for establishing the connection between the pin 111 and the substrate body 102 is welded to substantially the overall surface of the exposed connection pad 104 and portions of the large-diameter portion 111A and the shaft portion 111b such that the soldering material 115 forms substantially a truncated-cone fillet shape.

When the resin substrate 101 has been joined to the socket, a large gap DSA is formed between the first main surface 102A of the substrate body 102 and the upper surface SKA of the socket SK, for example, as shown in FIG. 7. When the resin substrate 101 is mounted on another substrate or the like, also a large gap is formed. The reason for this lies in that the soldering material 115 upwards moved and welded to the shaft portion 111b of the pin 111 when the pin 111 is soldered to the substrate body 102 substantially enlarges the diameter of the shaft portion 111b of the pin 111. Thus, the shaft portion 111B cannot sufficiently deeply be inserted into the socket SK or a through hole of the other substrate.

If the large gap is formed, the overall height realized after the resin substrate 101 has been joined to the socket SK or the like is enlarged excessively. Thus, a requirement for reducing the height cannot be met. The pin 111 of a type which projects over the first main surface 102A by a short length sometimes suffers from unsatisfactory reliability of the connection with the socket SK or the like. Moreover, a requirement for connecting the substrate made of the resin 101 and the socket SK or the other substrate to each other for a shortest distance cannot be met.

As the wettability between the soldering material 115 and the Au-plated layer on the surface of the pin 111 is improved, the height HSA of the soldering material 115 which upwards moves when the pin 111 is secured is enlarged. When the wettability is adjusted to reduce the height HSA of the soldering material 115 which upwards moves, it can be considered that the overall height realized after the resin substrate 101 has been joined to the socket SK or the like can be reduced.

SUMMARY OF THE INVENTION

It is an object of the present invention to provide a resin substrate with which the gap between the substrate body and another substrate or the like can be reduced when the resin substrate having a multiplicity of pins serving as input/output terminals and stood erect is joined to a socket or another substrate.

According to the present invention, there is provided a resin substrate, comprising: a substrate body made of resin or a composite material containing resin and formed into a plate-like shape which has a first main surface; and a pin having a surface on which an Au-plated layer is formed, wherein the pin is soldered to the substrate body with a soldering material mainly composed of Sn and Sb so as to be projected over the first main surface of the substrate body.

The present invention has the structure that the soldering material for securing the pin and the substrate body to each other is the soldering material mainly composed of Sn and Sb. The foregoing soldering material becomes wet with Au plating on the surface of the pin. The wettability is inferior to the Pb—Sn soldering material. Therefore, the foregoing soldering material, which is capable of soldering the pin to the substrate body, does not considerably upwards move along the pin.

Therefore, the portions to which the solder is welded and, the diameter of each of which is enlarged can be decreased. Hence it follows that the pin can sufficiently deeply be inserted into the socket or the through hole of another substrate. Therefore, the gap between the first main surface of the substrate body and the socket or the other substrate can be reduced. As a result, the overall height realized after the resin substrate has been joined to the socket or the like can be reduced.

The substrate body may be made of resin, such as epoxy resin, or an insulating material made of a composite material of the foregoing resin and glass fibers. The substrate body includes a laminated circuit substrate having a core substrate, on either side or two sides of which insulating layers and circuit layers are alternately laminated. As an alternative to this, a laminated circuit substrate having no core substrate and having the foregoing laminated structure is included.

The pin must have the surface on which the Au-plated layer is formed. The bonding strength of the substrate body or the like must be considered to arbitrary select the pin. The pin may be a pin in the form of the head of a nail or a pin having a large-diameter portion in an intermediate portion thereof. The material of the pin is exemplified by metal, such as covar, a 42NI—Fe alloy or a copper alloy. It is preferable that a Ni-plated layer is formed as the base layer for the Au-plated layer.

The soldering material must mainly be made of tin (hereafter "Sn") and antimony (hereafter "Sb"). In consideration of the melting point and the bonding strength, the quantity of the foregoing elements must be determined. In addition to the elements, such as Sn and Sb, silver (hereafter "Ag"), bismuth (hereafter "Bi"), Au, Pb, indium (hereafter "In"), aluminum (hereafter "Al"), arsenic (hereafter "As") or the like may be added in a small quantity.

In the present invention, it is preferable that the height of the pin projecting over the first main surface is 2 mm or smaller.

If the length of the pin projecting over the first main surface of the substrate body is too short, that is, if the length is 2 mm or smaller, the portion of the pin which can be inserted into the socket or the through hole of the substrate is too short to reliably connect the resin substrate to the socket or the like when upward movement of the soldering material takes place greatly. If the connector of the socket is brought into contact with the soldering material which covers the pin, the reliability of the connection sometimes deteriorates as compared with the reliability realized when the contact with the Au-plated layer is made.

The present invention, which is arranged to use the soldering material mainly composed of Sn and Sb having a poor wettability with the pin as compared with the lead-tin (hereafter "Pb—Sn") soldering material, is able to prevent upward movement of the soldering material which occurs when the pin is secured. Although the portion of the pin which projects over the substrate body is short, a sufficiently long portion of the pin, which is inserted into the socket, or the through hole of the other substrate can be maintained. As a result, the resin substrate can reliably be connected to another substrate or the like.

In the present invention, it is preferable that the thickness of the Au-plate layer of the pin is 0.04 μm or larger.

If the thickness of the Au-plated layer on the surface of the pin is enlarged, the soldering material is easily wetted. Thus, the height realized by the upward movement is enlarged. Therefore, when a soldering material, such as a Pb—Sn soldering material, having considerable wettability is used, the thickness of the Au-plated layer cannot be enlarged.

On the other hand, the present invention arranged to use the Sn—Sb soldering material and having poor wettability is able to prevent upward movement if the Au-plated layer having a large thickness is formed. Therefore, the Au-plated layer having a large thickness of 0.04 μm or larger, for example, 0.05 μm or 0.1 μm, can be formed to maintain the antioxidation characteristic and reliability of the connection with the socket or the like.

In the present invention, it is preferable that the quantity of Sb contained in the soldering material is 15 wt % or lower.

If the melting point of the strength material is too high, the operation for soldering the pin to the substrate body sometimes encounters deterioration in the characteristics of the substrate body, in particular, the resin insulating layer, at the soldering temperature according to the material. Moreover, the substrate body is sometimes decolored.

According to the present invention, the soldering material is mainly composed of Sn and Sb and arranged to contain Sb by 15 wt % or smaller. Therefore, the melting point of the soldering material is 280° C. or lower. Hence it follows that the pin can be soldered to the substrate body at a low soldering temperature. As a result, a material having excellent heat resistance is not required when the soldering operation is performed. Thus, reliable connection can be performed without any deterioration in the characteristics of the substrate body. Moreover, decoloration of the substrate body can be prevented or restrained. Since wettability required to secure the pin and the substrate body to each other can sufficiently be maintained, the reliability of the connection between the pin and the substrate body can be improved.

In the present invention, it is preferable that the quantity of Sb contained in the soldering material is not less than 3 wt % nor more than 15 wt %.

When the quantity of Sb contained in the Sn—Sb soldering material is 3 wt % or larger, deterioration in the wettability of the soldering material apparently occurs. Therefore, when the quantity of contained Sb is 3 wt % or larger, upward movement of the soldering material which takes place when the pin is secured can reliably be prevented. Hence it follows that manufacturing yield of the resin substrate can furthermore be improved.

In the present invention, it is preferable that the melting point of the soldering material is 280° C. or lower.

As described above, if the melting point of the strength material is too high, the operation for soldering the pin to the substrate body sometimes encounters deterioration in the characteristics of the substrate body, in particular, the resin insulating layer, at the soldering temperature according to the material. Moreover, the substrate body is sometimes decolored.

Since the present invention is structured such that the melting point of the soldering material is 280° C. or lower, a material having excellent heat resistance is not required when the pin is secured to prevent or restrain deterioration in the characteristics of the substrate body.

PREFERRED EMBODIMENTS OF THE INVENTION (Embodiments 1, 2 and 3)

Preferred embodiments of the present invention will now be described with reference to the drawings.

Figure 1:
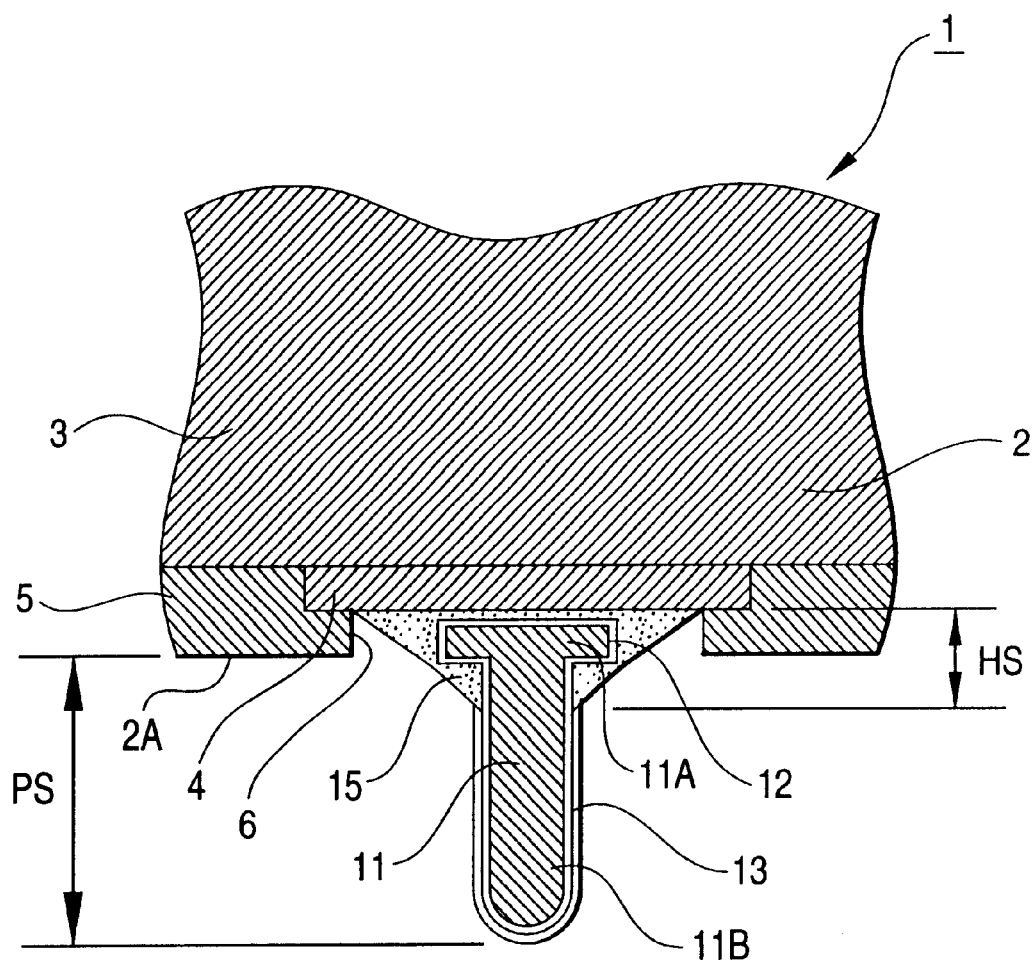
FIG. 1 partially-enlarged cross sectional view showing a resin substrate according to embodiments 1 to 3.

A resin substrate according to the present invention is shown in FIG. 1 which is a partially-enlarged cross sectional view.

The substrate 1 made of resin has a substrate body 2 formed into substantially a rectangular shape having size of 32 mm×36 mm and a thickness of 1 mm. A first main surface 2A of the substrate body 2 has a nail-head-shape pins 11 serving as input/output terminals stood erect to form a lattice configuration by using a soldering material 15 made of Sn—Sb. Embodiments 1, 2 and 3 have the same structure except for the different soldering materials 15. Embodiment 1 is arranged to use a soldering material (having a melting point of 240° C.) made of 95Sn—5Sb, embodiment 2 is arranged to use a soldering material (having a melting point of 235° C.) made of 98Sn—2Sb and embodiment 3 is arranged to use a soldering material (having a melting point of 315° C.) made of 80Sn—20Sb.

The substrate body 2 has a resin insulating layer 3 made of epoxy resin and a circuit layer (not shown) made of copper. The first main surface 2A has a connection pad 4 made of copper. An opening 6 (having a diameter of 0.65 mm) is formed to reach the edge of the connection pad 4. Moreover, a solder resist layer 5 (having a thickness of 20 μm) made of epoxy resin is formed.

On the other hand, the pin is made of covar and having a nail-head-shape large-diameter portion 11A (having a diameter of 0.6 mm and a height of 0.1 mm) and a shaft portion 11B (having a diameter of 0.38 mm and a height (a length) of 0.95 mm). A Ni—P plated layer 12 having a thickness of 2 μm is formed on the overall surface of the pin 11. Moreover, an Au-plated layer 13 having a thickness of 0.05 μm is formed on the surface of the Ni—P plating layer 12. When a manufacturing process is performed, contact of the soldering material 15 with the Au-plated layer 13 causes the Au plating 13 to be dissolved and dispersed in the soldering material 15. Therefore, the soldering material 15 is welded to the Ni—P plating 12 in the portions of the surface of the pin 11 to which the soldering material 15 has been welded.

The substrate body 2 and the pin 11 are secured to each other with the soldering material 15 such that the large-diameter portion 11A of the pin 11 is positioned opposite to the connection pad 4 exposed to the outside over the solder resist layer 5 of the substrate body 2. The height PS of projection of the pin 11 when viewed from the first main surface is 1 mm. The soldering material 15 is welded to substantially the overall surface of the exposed connection pad 4, the overall body of an engaging portion 11A of the pin 11 and a portion (an upper portion in the drawing) of the shaft portion 11B such that a moderate circular truncated cone fillet shape is formed. The height HS of upward movement of the welded soldering material 15 over the connection pad 4 is 0.25 mm in embodiment 1, 0.35 mm in embodiment 2 and 0.06 mm in embodiment 3.

Figure 2:
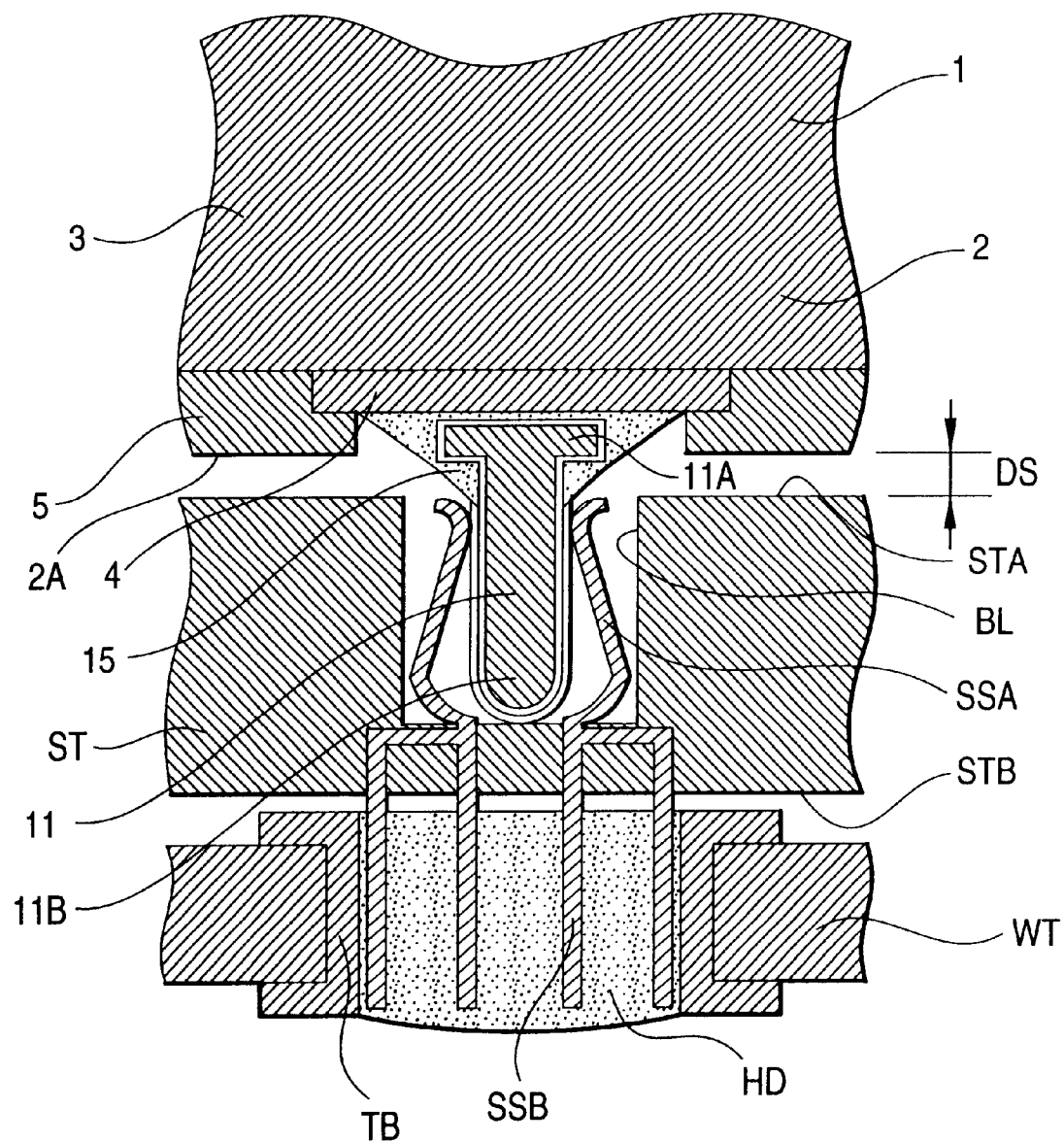
FIG. 2 is a partially-enlarged cross sectional view showing a state in which the resin substrate according to embodiments 1 to 3 has been joined to a socket.

FIG. 2 is a partially-enlarged cross sectional view showing a state in which the substrate 1 made of resin has been joined to a socket ST.

The socket ST has an upper surface STA in which a multiplicity of blind holes BL are formed at positions corresponding to the positions of the pins 11 of the substrate 1 made of resin. Moreover, the socket ST has contacts SSA for securing the shaft portions 11B of the pins 11 inserted into the blind holes BL; and terminals SSB molded integrally with the contacts SSA and allowed to project over a lower surface STB of the socket.

The terminals SSB projecting over the lower surface STB of the socket ST are inserted into through via conductors of another substrate WT so as to be secured by using a soldering material HD.

The height HS of upward movement of the soldering material 15, the appearance of the substrate 1 made of resin and the like were examined as follows.

The height HS of upward movement of the soldering material 15 of the substrate 1 made of resin according to each of embodiments 1, 2 and 3 was measured. Thus, average values of five samples were obtained. Moreover, the appearance of the resin substrate 1 to which the pins 11 have been soldered was inspected. As comparative examples, substrates made of resin which were the same as those according to the embodiment except for the soldering materials were manufactured. Then, the height HS of upward movement and the appearance were similarly measured and inspected.

Results of measurement were collectively shown in Table 1.

TABLE 1

| | Component | HS (mm) | Melting Point of Soldering Material (° C.) | Temperature of Soldering Material (° C.) | Appearance |
| --- | --- | --- | --- | --- | --- |
| Embodiment 1 | 95Sn5Sb | 0.25 | 240 | 250 | satisfactory |
| Embodiment 2 | 98Sn2Sb | 0.35 | 235 | 245 | satisfactory |
| Embodiment 3 | 80Sn20Sb | 0.06 | 315 | 325 | deteriorated |
| Comparative Example 1 | 37Pb63Sn | 0.84 | 183 | 210 | satisfactory |
| Comparative Example 2 | 50Pb50Sn | 0.74 | 226 | 236 | satisfactory |

As can be understood from Table 1, the height HS of upward movement of the soldering material 15 which was Sn—Sb soldering material according to embodiments 1, 2 and 3 was 0.25 mm in embodiment 1, 0.35 mm in embodiment 2 and 0.06 mm in embodiment 3. As compared with comparative examples (0.84 mm in Comparative Example 1 and 0.74 mm in Comparative Example 2) arranged to use the Pb—Sn soldering material, the height HS of upward movement was reduced. In particular, embodiments 1 and 3 containing Sb by 3 wt % or larger were able to reduce the height HS of upward movement of the soldering material 15.

On the other hand, Comparative Examples 1 and 2 arranged to use the Pb—Sn soldering material encountered a fact that a major portion of projection of each pin was wetted with the solder. Therefore, the length of each pin which can be inserted into the socket is insufficiently short. Hence it follows that the resin substrate cannot reliably be joined to the socket.

Note that embodiment 3 encountered a fact that the substrate body was partially decolored and the insulating layer deteriorated. The substrates made of resin except for embodiment 3 has the structures that the melting point of the soldering material is 240° C. in embodiment 1, 235° C. in embodiment 2, 183° C. in Comparative Example 1 and 226° C. in Comparative Example 2. The foregoing temperatures were relatively low temperatures which were 280° C. or lower. Also the soldering temperatures are somewhat higher than the melting points by about 10° C. On the other hand, embodiment 3 is arranged to use the soldering material having the melting point which is 315° C. and arranged to perform soldering at 325° C. Thus, the temperatures are high as described above. When a substrate body made of a material, such as polyimide, having excellent heat resistance is employed, decoloration of the substrate body and deterioration in the insulating layer do not occur if the soldering material (80Sn—20Sb) according to embodiment 3 is employed.

As described above, the substrate 1 made of resin according to embodiments 1, 2 and 3 has the structure that the soldering material 15 for securing the pins 11 and the substrate body 2 is made of Sn—Sb. Therefore, low wettability can be realized as compared with the Pb—Sn soldering material. Therefore, the height HS of upward movement of the soldering material 15 can be reduced. In particular, the quantity of contained Sb is 3 wt % or larger such that the quantity is 5 wt % in embodiment 1 and 20 wt % in embodiment 3. Therefore, the height HS of upward movement of the soldering material 15 can furthermore be reduced.

Therefore, the pins 11 can sufficiently deeply be inserted into the socket ST. Thus, gap DS between the first main surface 2A of the substrate body 2 and the upper surface STA of the socket ST can be reduced. Therefore, the overall height realized after the substrate 1 made of resin has been joined to the socket ST can be reduced.

The length (projection length) PS of the pin 11 projecting over the first main surface 2A is a short length of 1 mm. However, also the height HS of upward movement of the soldering material 15 is reduced such that the HS is 0.25 mm in embodiments 1, 0.35 mm in embodiments 2 and 0.6 mm in embodiments 3. Therefore, the diameter of the shaft portion 11B can be enlarged, causing the portion which cannot be inserted into the socket ST to be reduced. As a result, the substrate 1 made of resin can reliably be connected to the socket ST.

Since the Au-plated layer 13 formed on the surface of the pin 11 has a large thickness of 0.05 µm, the antioxidation characteristic and reliability of the connection with the socket ST (the contact SSA) can be improved.

The quantity of Sb contained in the soldering material 15 is 15 wt % or smaller such that the quantity was 5 wt % in embodiment 1 and 2 wt % in embodiment 2. Moreover, the melting point of the soldering material 15 is 280° C. or lower such that the melting point was 240° C. in embodiment 1 and 235° C. in embodiment 2. Therefore, a material having excellent heat resistance is not required to prevent decoloration of the resin insulating layer 3 and the solder resist layer 5 and deterioration in the insulating characteristic when soldering is performed.

A method of manufacturing the substrate 1 made of resin will now be described with reference to FIGS. 3A to 3C.

Figure 3A:
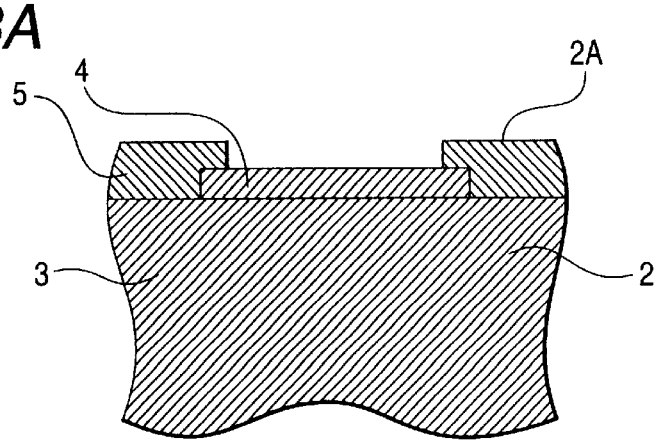
FIGS. 3A to 3C are diagrams showing a method of manufacturing the resin substrate according to embodiments 1 to 3, FIG. 3A showing the substrate body, FIG. 3B showing a state in which a solder ball has been placed on the substrate body and FIG. 3C showing a state in which the pin has been secured to the substrate body.

Initially, the substrate body 2 shown in FIG. 3A is manufactured. That is, a known method is employed to form the resin insulating layer 3. Then, the solder resist layer 5 is formed such that the connection pad 4 is exposed over the first main surface 2A.

Figure 3B:
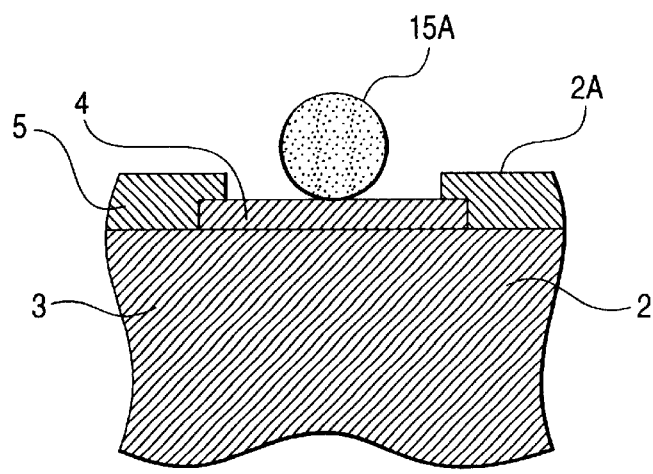
Figure 3C:
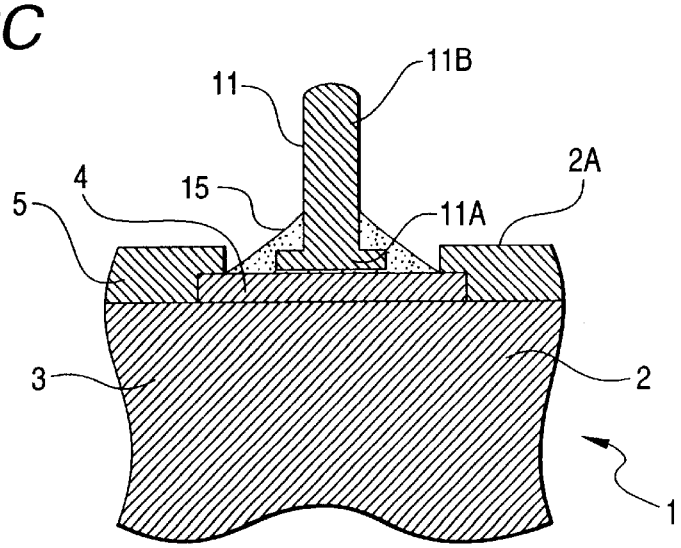

Then, as shown in FIG. 3B, a solder ball 15A made of Sn—Sb soldering material (95Sn—5Sb in embodiment 1, 98Sn—2Sb in embodiment 2 and 80Sn—20Sb in embodiment 3) is placed on the connection pad 4 of the first main surface 2A. Moreover, the pin 11 applied with the Ni—P plating 12 and the Au plating 13 is prepared. Then, the solder ball 15A is heated and melted at a temperature higher than the melting point of the soldering material by about 10° C. for one minute. As shown in FIG. 3C, portions of the large-diameter portion 11A and the shaft portion 11B of the pin 11 adjacent to the connection pad 4 are secured to the substrate body 2. Thus, the substrate 1 made of resin according to this embodiment is manufactured.

The soldering material 15 is wetted by the shaft portion 11B of the pin 11 which is applied with the Au plating 13 so as to be formed into a moderate fillet shape having a relatively low height HS of upward movement. The Au-plated layer 13 made contact with the soldering material 15 is melted and dispersed in the soldering material 15 in a very short time. Therefore, the soldering material 15 is welded to the Ni—P-plated layer 12 of the pin 11, as shown in FIG. 1.

(Embodiments 4, 5 and 6)

Figure 4:
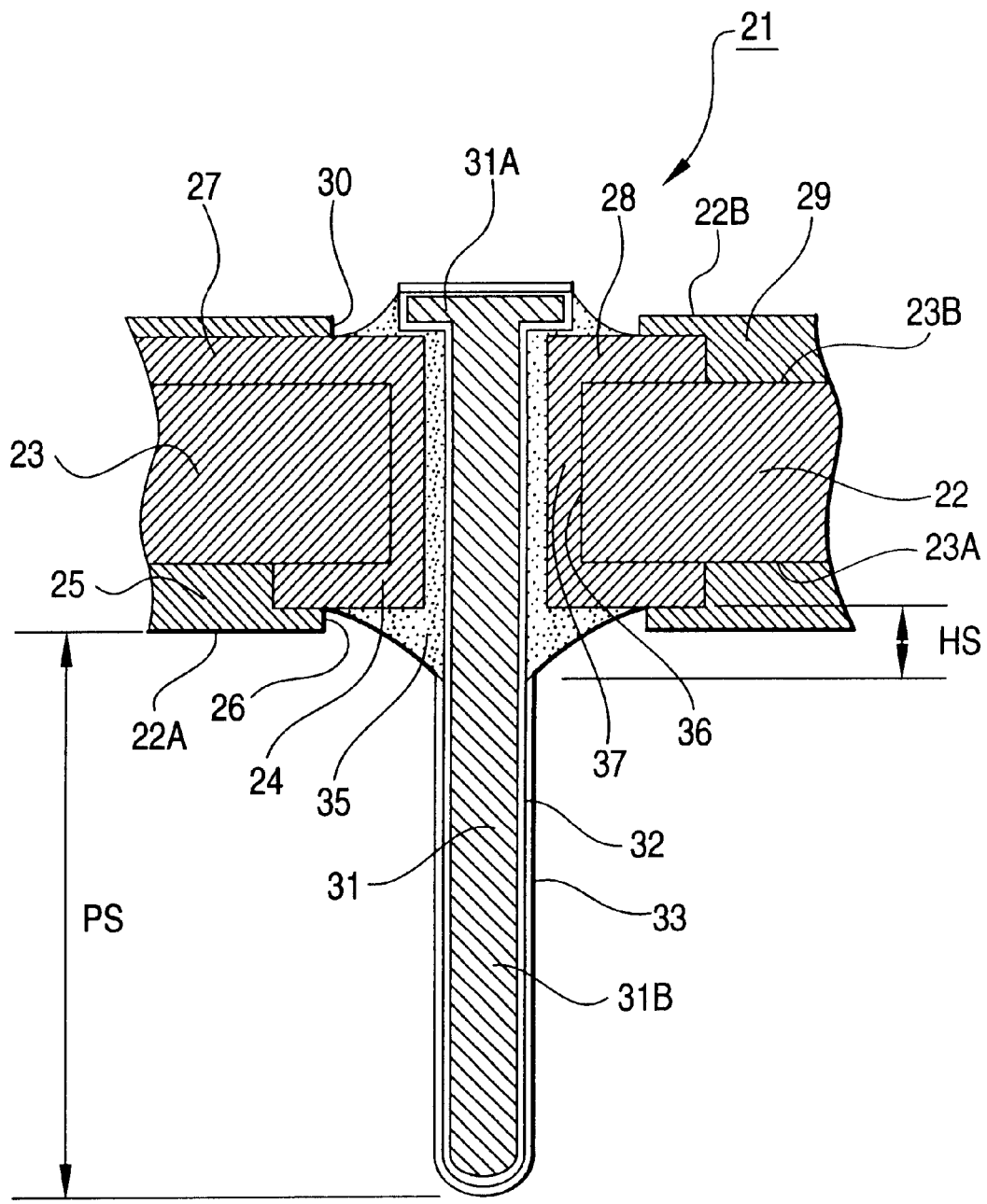
FIG. 4 is a partially-enlarged cross sectional view showing a resin substrate according to embodiments 4 to 6.

Embodiments 4, 5 and 6 will now be described with reference to FIG. 4. A substrate 21 made of resin according to embodiments 4, 5 and 6 is different from embodiments 1, 2 and 3 in that a nail-head-shape pin 31 penetrates the substrate body 22 from the second main surface 22B to the first main surface 22A. The other structures are the same as embodiments 1, 2 and 3. Therefore, similar portions to those of embodiments 1, 2 and 3 are omitted from description or described simply.

The substrate 21 made of resin has a substrate body 22 formed into substantially a rectangular shape and having a multiplicity of nail-head-shape pins 31 in the lattice-like configuration by using a soldering material 35 made of Sn—Sb. Embodiments 4, 5 and 6 are different from one another in only the soldering materials 35. The other portions are the same. A soldering material (having a melting point of 240° C.) made of 95Sn—5Sb is employed in embodiment 4, a soldering material (having a melting point of 235° C.) made of 98Sn—2Sb is employed in embodiment 5 and a soldering material (having a melting point of 315° C.) made of 80Sn—20Sb is employed in embodiment 6.

The substrate body 22 has a resin insulating layer 23 and solder resist layers 25 and 29. The resin insulating layer 23 has a through hole 36 formed from the lower surface 23A to the upper surface 23B. Moreover, a through via conductor 37 is formed in the inner wall of the through hole 36. A first connection pad 24 is formed around the through hole 36 at a position on the lower surface 23A. A solder resist layer 25 having an opening 26 is formed to reach the first connection pad 24. On the other hand, a circuit layer 27 is provided for the upper surface 23B. A solder resist layer 29 having an opening 30 is formed in the portion of the second connection pad 28 formed around the through hole 36.

On the other hand, the pin 31 is made of covar and having a nail-head-shape large-diameter portion 31A (having a diameter of 0.6 mm and a height of 0.1 mm) and a shaft portion 31B (having a diameter of 0.38 mm and a height (a length) of 2 mm. A Ni—P-plated layer 32 having a thickness of 2 µm is formed on the overall surface of the pin 31. Moreover, an Au-plated layer 33 having a thickness of 0.05 µm is formed on the Ni—P-plated layer 32. Similarly to embodiments 1, 2 and 3, portions of the surface of the pin 31 to which the soldering material 35 has been welded are welded to the Ni—P-plated layer 32.

The pin 31 is soldered while the large-diameter portion 31A is being engaged to the second connection pad 28. The shaft portion 31B penetrates the through via conductor 37 to project downwards over the first main surface 22A so as to be soldered to the through via conductor 37 and the first connection pad 24. Thus, the pins 31 are secured to the substrate body 22. The portion of the soldering material 35 welded to the portion of the first connection pad 24 and the shaft portion 31B of the pin 31 is formed into a moderate fillet shape in the form of a circular truncated cone shape. The height HS of upward movement of the welded soldering material 35 over the first connection pad 24 is 0.22 mm in embodiment 4, 0.33 mm in embodiment 5, and 0.05 mm in embodiment 6. Note that the height PS of projection of the pin 31 over the first main surface 22A is 1 mm.

Figure 5:
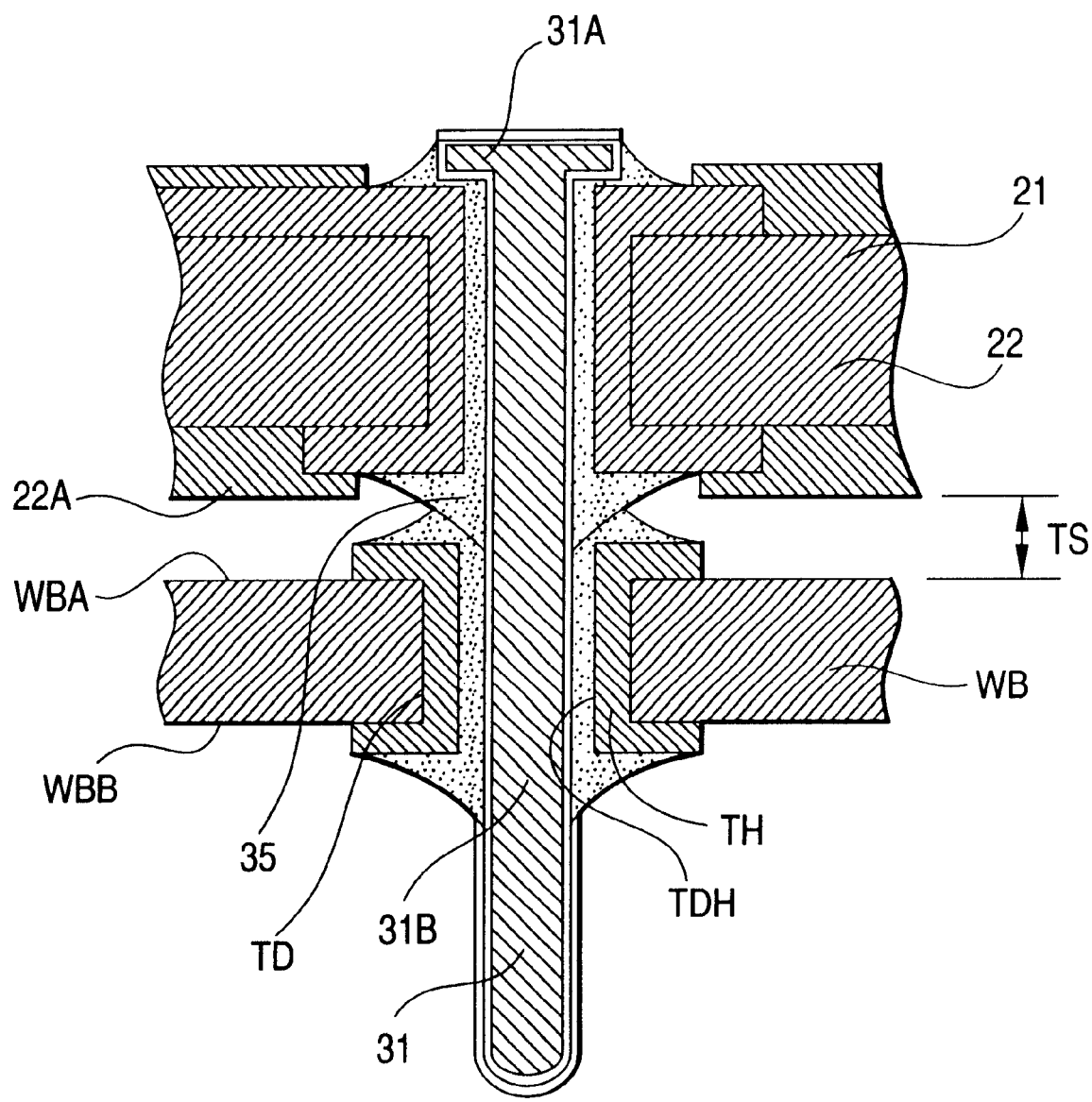
FIG. 5 is a partially-enlarged cross sectional view showing a state in which the resin substrate according to embodiments 4 to 6 has been joined to the other substrate.
Figure 6:
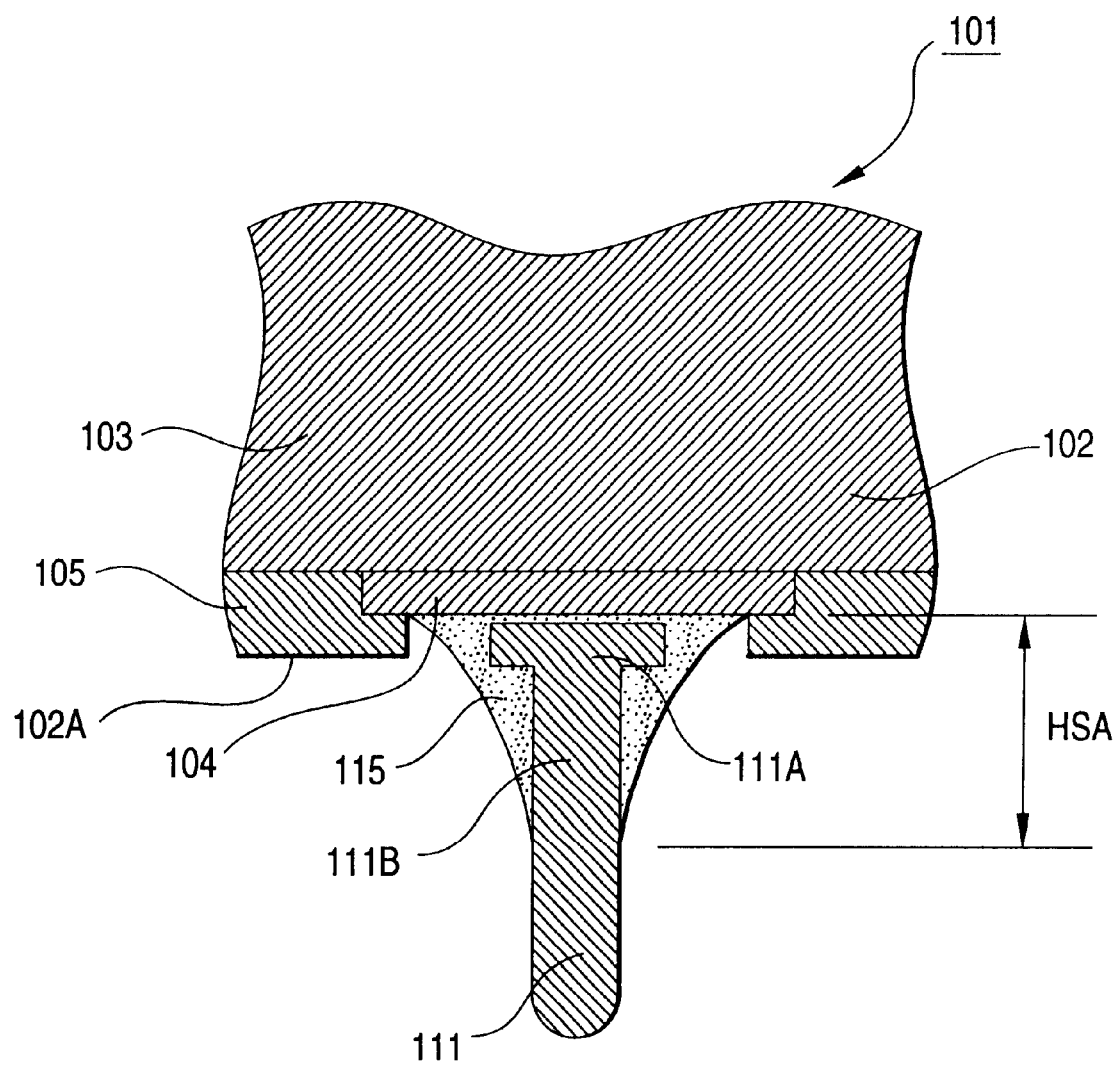
FIG. 6 is a partially-enlarged cross sectional view showing a conventional substrate.
Figure 7:
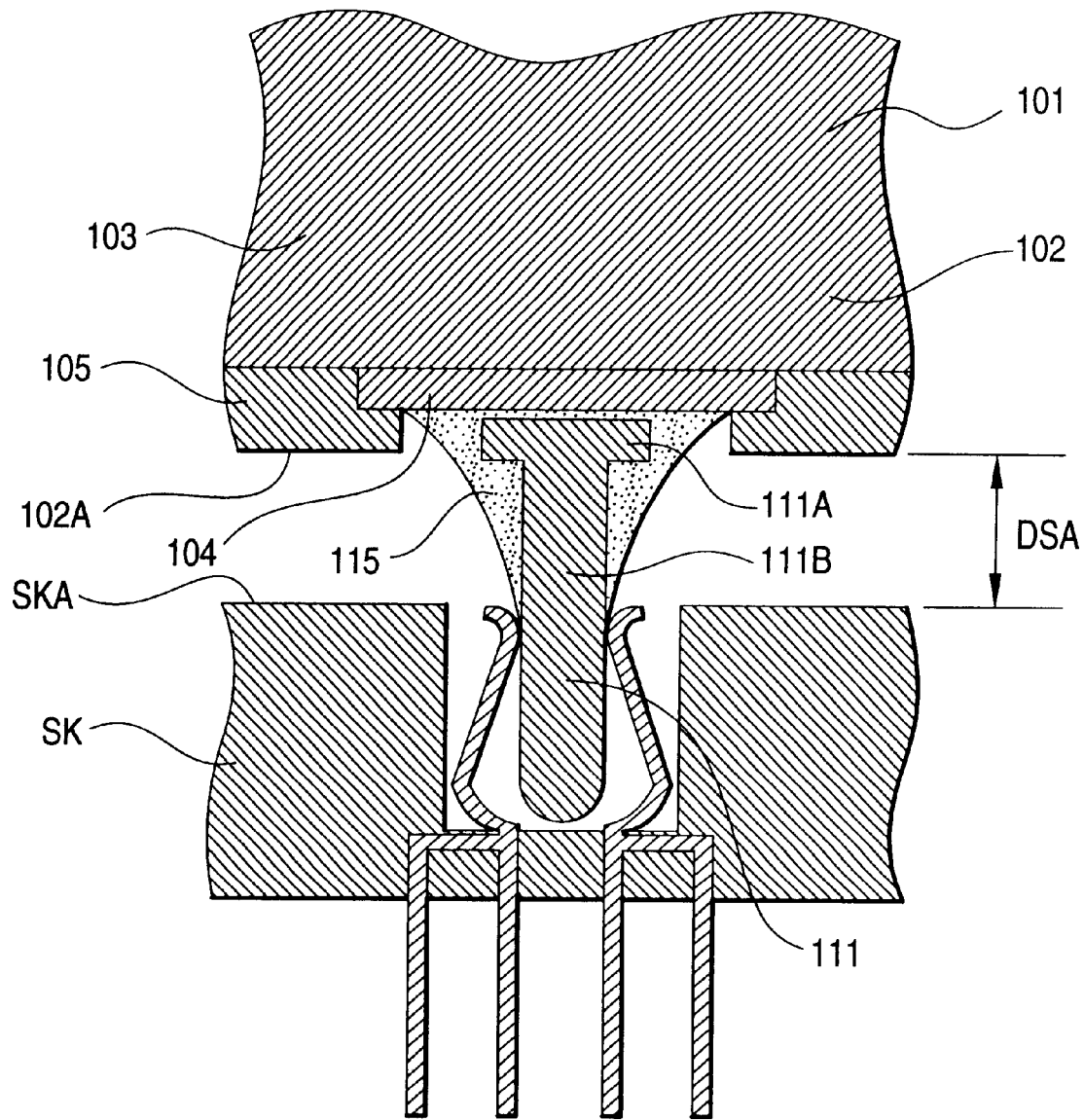
FIG. 7 is a partially-enlarged cross sectional view showing a state in which the conventional substrate has been joined to a socket.

FIG. 5 is a partially enlarged cross sectional view showing a state in which the substrate 21 made of resin has been joined to another substrate WB. The substrate WB has a multiplicity of through holes TH corresponding to the positions of the pins 31 of the substrate 21 made of resin. A cylindrical conductor layer TD having a through hole TDH is formed in the inner wall of the through holes TH and around the through holes TH of the upper and lower main surfaces WBA and WBB. A portion of the shaft portion 31B of the pin 31 is inserted into the through hole TDH of the other substrate WB so as to be soldered. Thus, the substrate 21 made of resin is connected to the other substrate WB.

The height HS of upward movement of the soldering material 35, the appearance of the substrate 21 made of resin and the like were examined as follows.

The height HS of upward movement of the soldering material 35 of the substrates 21 made of resin according to embodiments 4, 5 and 6 having the structures that the compositions of the soldering materials 35 were different from one another was measured. An average value of five samples was obtained. Also the appearance of the substrate 21 made of resin was inspected. As comparative examples, substrates made of resin were manufactured which were the same as those according to embodiments 4, 5 and 6 except for the soldering materials to perform similar measurement and inspection.

Results of the measurement were shown in Table 2.

TABLE 2

| | Component | HS (mm) | Melting Point of Soldering Material (° C.) | Temperature of Soldering Material (° C.) | Appearance |
|---|---|---|---|---|---|
| Embodiment 4 | 95Sn5Sb | 0.22 | 240 | 250 | satisfactory |
| Enbodiment 5 | 98Sn2Sb | 0.33 | 235 | 245 | satisfactory |
| Embodiment 6 | 80Sn20Sb | 0.05 | 315 | 325 | deteriorated |
| Comparative Example 3 | 37Pb63Sn | 0.81 | 183 | 210 | satisfactory |
| Comparative Example 4 | 50Pb50Sn | 0.70 | 226 | 236 | satisfactory |

As can be understood from Table 2, similarly to the foregoing inspection, the resin substrate (according to embodiments 4, 5 and 6) arranged to use the Sn—Sb soldering material is able to reduce the height HS of upward movement of the soldering material as compared with Comparative Examples 3 and 4 arranged to use the Pb—Sn soldering material. In particular, embodiments 4 and 6 arranged to contain Sb by 3 wt % or larger are able to reduce the height HS of upward movement of the soldering material.

On the other hand, Comparative Examples 3 and 4 arranged to use the Pb—Sn soldering material encounter wetting of a major portion of projection of the pin with the solder. Therefore, the shaft portion of the present invention cannot sufficiently deeply be inserted into the through hole TDH of the other substrate WB.

Note that embodiment 6 encountered a fact that the substrate body was partially decolored and the insulating layer deteriorated. Similarly to the foregoing inspection, the substrates made of resin except for embodiment 6 has the structures that the melting point of the soldering material is a relatively low temperature of 280° C. or lower. Also the soldering temperatures are somewhat higher than the melting points by about 10° C. On the other hand, embodiment 6 is arranged to use the soldering material having the melting point which is 315° C. and arranged to perform soldering at 325° C. Thus, the temperatures are high as described above. When a substrate body made of a material, such as polyimide, having excellent heat resistance was employed, decoloration of the substrate body and deterioration in the insulating layer did not occur when the soldering material according to embodiment 6 was employed, similarly to embodiment 3.

As described above, the substrate 21 made of resin according to embodiments 4, 5 and 6 has the structure that the soldering material 35 for securing the pins 31 and the substrate body 22 is made of Sn—Sb. Therefore, low wettability can be realized as compared with the Pb—Sn soldering material. Therefore, the height HS of upward movement can be reduced. It leads to a fact that the shaft portion 31B of the pin 31 can sufficiently deeply be inserted into the through hole TDH. Thus, gap TS between the first main surface 22A of the substrate body 22 and the upper surface WBA of the other substrate WB can be reduced. Therefore, the overall height realized after the substrate 21 made of resin has been connected to the other substrate WB can be reduced.

The projection height PS of the pin 31 is a short length of 1 mm. However, also the height of upward movement of the soldering material 15 is reduced. Therefore, the portion of the shaft portion 11B, the diameter of which is enlarged, is decreased. Thus, the pin can deeply be inserted into the through hole TDH of the other substrate WB so that reliable connection is established.

Since the Au-plated layer 33 formed on the surface of the pin 31 has a large thickness of 0.05 $\mu$m, the antioxidation characteristic and reliability of the connection with the other substrate WB can be improved.

Moreover, the melting point of the soldering material 35 according to embodiments 4 and 5 is relatively low. Therefore, a material having excellent heat resistance is not required to prevent decoloration of the resin insulating layer 23 and the solder resist layer 25 and deterioration in the insulating characteristic when soldering is performed at a high temperature.

The substrate 21 made of resin according to this embodiment is manufactured such that the substrate body 22 is manufactured by a known method. Then, an annular solder preform made of the Sn—Sb soldering material 35 (95Sn—5Sb in embodiment 4, 98Sn—2Sb in embodiment 5 and 80Sn—20Sb in embodiment 6) is placed on the second connection pad 28 of the first main surface 22A of the substrate body 22. Then, the pins were inserted, and then the soldering material 35 is heated at a temperature which is higher than the melting point by about 10° C. for one minute. Thus, the pins 31 are secured to the substrate body 22 so that the substrate 21 made of resin is manufactured.

The embodiments of the present invention have been described. The present invention is not limited to the description of the embodiments. As a matter of course, arbitrary modifications may be performed within the scope of the spirit of the present invention.

For example, embodiments 1, 2 and 3 have the structure that the substrate 1 made of resin is joined to the socket ST. In embodiments 4, 5 and 6, the substrate 21 made of resin is joined to the other substrate WB. The substrate 1 made of resin according to embodiments 1 and the like may be joined to the other substrate or the substrate 21 made of resin according to embodiments 4 and the like may be joined to the socket. The length of each of the shaft portions 11B and 31B of the pins 11 and 31 may arbitrarily be adjusted. In any case, the height HS of upward movement of the soldering materials 15 and 35 can be reduced. Therefore, the gap between each of the substrate bodies 2 and 22 and the other substrate or the socket can be reduced.

What is claimed is:

1. A resin substrate comprising:
   a substrate body made of resin or a composite material containing resin and formed into a plate-like shape which has a main surface;
   a connection pad coupled to said substrate;
   a pin having a surface on which an Au-plated layer is formed, the pin extending at a distance from the main surface; and a soldering material comprising Sn and 2% to 20% by weight of Sb, the soldering material connecting the pin to the connecting pad, the soldering material generally forming a cone between the connection pad and a portion of the pin, the cone having a height, wherein the Au-plated layer and the soldering material interact to limit the height of the cone to no more than about thirty-three percent of the distance at which the pin extends from the main surface.

2. The resin substrate according to claim 1, wherein the distance of said pin extending from said main surface is 2 mm or smaller.

3. The resin substrate according to claim 2, wherein a thickness of said Au-plated layer of said pin is 0.04 μm or larger.

4. The resin substrate according to claim 3, wherein the quantity of Sb contained in said soldering material is 15 wt % or smaller.

5. The resin substrate according to claim 3, wherein said soldering material has a melting point of 280° C. or lower.

6. The resin substrate according to claim 2, wherein the quantity of Sb contained in said soldering material is 15 wt % or smaller.

7. The resin substrate according to claim 2, wherein said soldering material has a melting point of 280° C. or lower.

8. The resin substrate according to claim 1, wherein said soldering material further comprises at least one of Ag, Bi, Au, Pb, In, Al, As.

9. The resin substrate according to claim 1, wherein the soldering material comprises 3% to 15% by weight of Sb.

* * * * *